(12) United States Patent
Carriere

(10) Patent No.: US 8,248,498 B2
(45) Date of Patent: Aug. 21, 2012

(54) PHOTOSENSITIVE MICROELECTRONIC DEVICE WITH AVALANCHE MULTIPLIERS

(75) Inventor: Nicolas Carriere, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 431 days.

(21) Appl. No.: 12/330,685

(22) Filed: Dec. 9, 2008

(65) Prior Publication Data

US 2009/0167910 A1    Jul. 2, 2009

(30) Foreign Application Priority Data

Dec. 10, 2007    (FR) ...................................... 07 59730

(51) Int. Cl.
*H04N 3/14* (2006.01)
(52) U.S. Cl. ........................................................ 348/294
(58) Field of Classification Search .................. 348/294
See application file for complete search history.

(56) References Cited

U.S. PATENT DOCUMENTS

| | | | | |
|---|---|---|---|---|
| 7,045,754 | B2 * | 5/2006 | Manabe et al. | 250/208.1 |
| 7,821,042 | B2 * | 10/2010 | Nakashima et al. | 257/217 |
| 7,910,874 | B2 * | 3/2011 | Atlas et al. | 250/214 A |
| 2006/0163474 | A1 * | 7/2006 | Denvir | 250/305 |
| 2006/0175536 | A1 | 8/2006 | Kim et al. | |
| 2006/0238635 | A1 * | 10/2006 | Atlas et al. | 348/311 |
| 2007/0176213 | A1 * | 8/2007 | Oda | 257/247 |
| 2007/0214200 | A1 * | 9/2007 | Hazelwood | 708/200 |
| 2008/0048212 | A1 * | 2/2008 | Nakashima et al. | 257/222 |

FOREIGN PATENT DOCUMENTS

| | | |
|---|---|---|
| JP | 07 030816 A | 1/1995 |
| WO | WO 03 067663 A | 8/2003 |
| WO | WO 2004/019609 A3 | 3/2004 |

OTHER PUBLICATIONS

Chen Xu et al., "A New Correlated Double Sampling (CDS) Technique for Low Voltage Design Environment in Advanced CMOS Technology", Solid State Circuits Conference 2002, ESSCIRC 2002, pp. 117-120.
Sudhir K. Madan et al., "Experimental Observation of Avalanche Multiplication in Charge-Coupled Devices", IEEE Transactions on Electron Devices, vol. ED-30, No. 6, Jun. 1983, pp. 694-699.
N. Moussy et al., "A Highly Reliable Amorphous Silicon Photosensor for above IC CMOS Image Sensor", Electron Devices Meeting, 2006, IEDM '06, pp. 1-3.

* cited by examiner

*Primary Examiner* — James Hannett
(74) *Attorney, Agent, or Firm* — Miles & Stockbridge P.C.

(57) ABSTRACT

Microelectronic image sensor array device comprising a plurality of elementary cells laid out according to an array and each provided with at least one photosensitive zone for capturing photon(s) and converting photon(s) into electron(s), at least one or several of said cells comprising electronic avalanche multiplier means, provided to produce, during cycles known as electron amplification cycles, a greater number of electrons than the number of electrons converted by the photosensitive zone, the device further comprising a control circuit adapted to modulate the amplification gain of each cell individually.

22 Claims, 5 Drawing Sheets

PHOTOSENSITIVE MICROELECTRONIC DEVICE WITH AVALANCHE MULTIPLIERS

TECHNICAL FIELD

The present invention relates to the field of microelectronic imaging or image sensor devices, in particular in CMOS technology.

The invention concerns a photosensitive microelectronic device as well as an image sensor provided with pixels formed of a photosensitive microelectronic device comprising a photosensitive zone associated with means for multiplying electrons by electronic avalanche comprising a plurality of control gates.

The invention brings improvements, particularly in terms of gain and sensitivity compared to conventional CMOS arrays, while making it possible to operate with a supply voltage less than that of CCD arrays according to the prior art.

The invention also brings improvements in terms of image dynamic.

STATE OF THE PRIOR ART

Generally it is aimed to integrate a greater and greater number of pixels within CMOS (complementary metal oxide semiconductor) or CCD (charge coupled device) type imaging devices. Consequently, the size of the pixels within such devices is smaller and smaller which makes it necessary to carry out a detection with a lower and lower number of photons collected.

In a CCD type array device, the charges are transferred from one pixel $p_i$ to the other $p_{i+1}$, in such a way as to cross the photosensitive array 10 and reach a reading circuit that may be in the form of a charge-voltage converter 20 situated outside of the array. The efficiency of each charge transfer is a critical element in the measurement where a loss during a transfer of electrons rapidly leads to a zero output after a hundred or so transfers. In order to minimise the losses, important production constraints, for example such as the doping of the substrate on which the array is formed, are provided for, and render these arrays incompatible with a low voltage avalanche operation.

In a conventional avalanche CCD array, in order to multiply the number of electrons collected, a multiplier 30 is added between the reading circuit 20 and a digital analogue converter 40. The signal from each of the pixels then crosses the same multiplier 30 (FIG. 1).

In order to maintain good detection sensitivity, as well as a good signal to noise ratio, it may then be worthwhile amplifying the photo-generated signal before reading it.

One means of multiplying the number of electrons collected is to use the phenomenon of ionisation by impact, wherein a strong electric field makes it possible to accelerate sufficiently the electrons to ionise a semi-conductor and extract from it additional electrons. Such means are implemented in sensors produced in CCD technology and described in the document: "Experimental Observation of Avalanche Multiplication in Charge-Coupled Devices", Madan et al., June 1983. For each transfer, the gain obtained may then be around 1%.

CMOS imagers differ fundamentally from CCD sensors, in that the reading circuit, for example a charge/voltage converter, is formed within a pixel, whereas in a CCD sensor, the charges are transferred to the exterior of the array before being read.

CMOS imagers have the advantages of having low consumption, good rapidity, and enabling analogue and digital circuits to be co-integrated on a same chip. Progress on the reading circuits of CMOS imagers have moreover made it possible to moderate the noise level of a CMOS imager to the level of that of a CCD imager.

However, the formation of pixels provided with amplification means is awkward. The formation of an array of avalanche photodiodes is known but poses numerous problems, such as the necessity of a high voltage supply, typically around 70V, and that of a cooling system. Moreover, with such a device, it is difficult to reduce the size of the pixels.

It is also known to form a pixel, by superimposing, on the reading circuit, a layer that makes it possible both to achieve the photon/electron conversion and to multiply the electrons. The layers used are generally of HARP (high gain avalanche rushing amorphous photoconductor) type. Such an architecture is disclosed in document WO 2004/019609 A2, and has the drawback of requiring a high supply voltage, typically around 70V, which entails having to protect the logic circuits operating for their part at low voltage, for example around 5 Volts.

In the two types of architectures, avalanche CCD and HARP type CMOS, only the supply voltage enables the gain of the pixel to be controlled, which leads to a large dispersion of the gain between pixels in large size imagers.

The problem is posed of finding a new imaging device provided with amplifier means integrated in the pixels, and which does not have the above mentioned drawbacks.

DESCRIPTION OF THE INVENTION

The invention concerns a photosensitive microelectronic detector device, in particular an array of image sensors, comprising several elementary cells or several elementary pixels, at least several elementary cells comprising:
  at least one photosensitive zone for capturing photon(s) and converting photon(s) into electron(s),
  multiplier means, provided to produce, by electronic avalanche or ionisation by impact, during cycle(s) known as electron "multiplication" cycles, a higher number of electrons than the number of electrons converted by the photosensitive zone, the multiplier means comprising at least one plurality of electrodes of control gates, opposite at least one semi-conducting zone.

At least one control circuit of said gates may be provided to apply control signals respectively to said control gates.

During the multiplication cycle(s), the multiplier means may have a given, desired gain, which may be adapted by the control circuit.

The gates of the multiplier means may be polarised, during one or several multiplication cycles, in such a way as to make a group of electrons make one or several back-and-fro journey(s) in a semi-conducting zone situated opposite said control gates.

The gain of the multiplier means may be adjustable.

This gain is modified or adjusted through the intermediary of the control circuit.

An array provided with cells comprising multiplier means with an adjustable gain may thereby be implemented.

The sequence(s) may be implemented and modified for example by means of the control circuit which may be for example in the form of at least one logic circuit.

The control circuit of said gates may be provided to apply control signals to each of said gates of the multiplier means according to a predetermined sequence, and may be provided to modify said predetermined sequence.

The control circuit may be adapted to apply first control signals to the gates of multiplier means of at least one first cell of the array, and to apply second control signals, different to said first signals, to the gates of multiplier means of at least one second cell of the array.

Thus, a different multiplication gain may be applied from one cell to the other of the array. This can make it possible to increase the dynamic of the image.

This also makes it possible not to saturate certain pixels that are highly saturated and to adapt the gain of these pixels in an independent manner between them.

It is possible for example to apply a first multiplication gain, for example a high multiplication gain, to one or several cells having received a first number of photons or a number of photons less than a given number of photons, and to apply a second multiplication gain, for example a low multiplication gain, to one or several cells having received a second number of photons greater than the first number or greater than the given number of photons.

The control circuit of said gates of the multiplier means of a cell, may be provided to apply at least one first control signal to a first gate of the multiplication means of a given cell, at least one second control signal of said multiplication means of said given cell, at least one third control signal to a third gate of said multiplication means of said given cell, the first signal according to a first sequence, the second signal according to a second sequence, and the third signal according to a third sequence, the first sequence, the second sequence, the third sequence being provided as a function of a desired multiplication gain.

The control circuit of said gates is adapted to modify the first sequence, the second sequence, and the third sequence, as a function of the desired gain.

To obtain different gains between the first cell and the second cell, the first signals applied to the multiplier means of the first cell may follow first sequences, whereas the second signals applied to the multiplier means of the second cell follow second sequences, different to the first sequences.

The second sequences may be a repetition of a given number X, times the first sequences.

The electron multiplication means may be provided with 3 gates or at least 3 gates.

The gates of the multiplier means may be controlled during one or several first multiplication cycles, in such a way as to make a group of electrons make a first given number of back-and-fro journey(s) in a semi-conducting zone situated opposite said control gates, and be controlled, during one or several other multiplication cycles, in such a way as to make a group of electrons make a number of back-and-fro journey(s) different to said first given number.

According to one embodiment possibility, the control circuit may be suited to applying at least one first sequence of control signals to the gates of multiplier means of at least one first cell of the array, and to apply at least one second sequence of control signals, different to the first sequence, to the gates of multiplier means of at least one second cell of the array.

At least several cells may each further comprise: at least one reading circuit, the reading circuit comprising, or being formed, of at least one charge/voltage converter or at least one charge/current converter.

According to one possibility, the multiplier means may be integrated in the reading circuit.

The reading circuit may be provide, to carry out at least one reading of a quantity of charge(s) produced by said photosensitive zone, prior to a multiplication cycle of this quantity of charge.

Following this reading, and prior to a multiplication cycle, the multiplication gain may be adapted, as a function of the reading carried out, in other words of the quantity of charge produced by the photosensitive zone.

The reading circuit may be provided to carry out a periodic reading of the quantity of charge(s) produced by said photosensitive zone.

Said control circuit may be provided, after a reading carried out by the reading circuit, to modify the gain of one or several given cells of the array.

According to one possibility, the microelectronic image sensor device may further comprise: correlated multiple sampling means.

According to one embodiment possibility, the photosensitive zone may overlay the gates of this multiplier means. The size of the pixels or elementary cells may thereby be reduced.

The photosensitive zone may be situated on a given face or a given side of a substrate, the gates of the multiplier means being formed on said given face or on said given side of said substrate.

BRIEF DESCRIPTION OF DRAWINGS

The present invention will be better understood on reading the description of embodiments given purely by way of indication and in no way limiting, and by referring to the appended figures in which.

Identical, similar or equivalent parts of the different figures described hereafter bear the same number references so as to make it easier to go from one figure to the next.

In order to make the figures easier to read, the different parts represented in the figures are not necessarily to the same scale.

DETAILED DESCRIPTION OF SPECIFIC EMBODIMENTS

Figure 1:
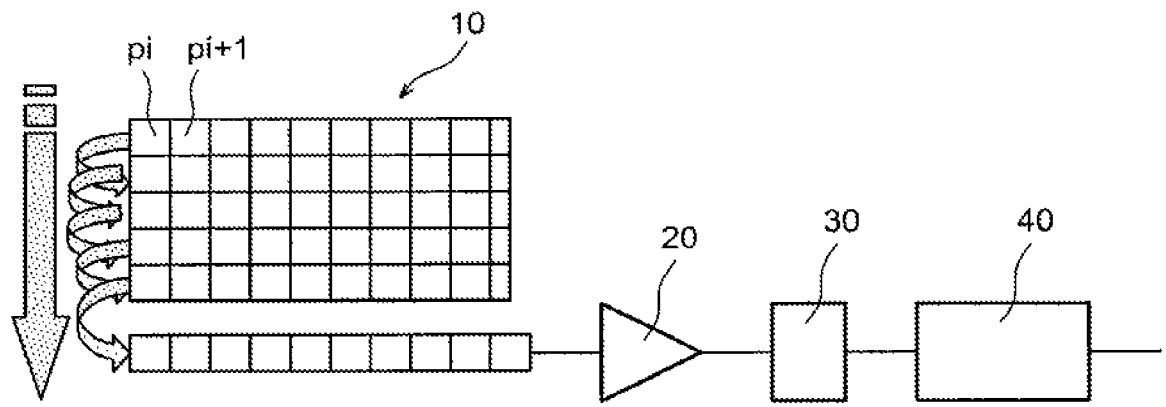
FIG. 1, illustrates an example of avalanche CCD imaging device according to the prior art.
Figure 2A:
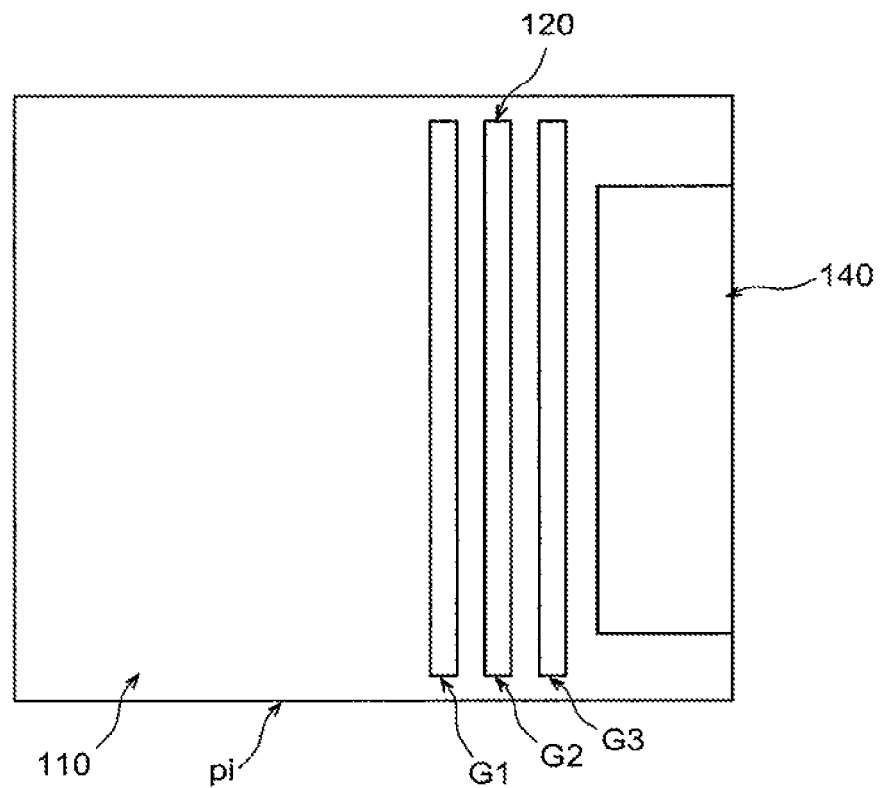
FIGS. 2A and 2B, illustrate an example of pixel of an imaging device according to the invention, and an array of pixels of an imager according to the invention.

An example of microelectronic imaging array device according to the invention is represented in FIG. 2A. This device comprises an array 100 of n horizontal rows and m vertical rows of elementary cells also known as pixels $p_i$ where n may be equal to m, and for example between 1 and 10000, for example equal to 2000.

Figure 2B:
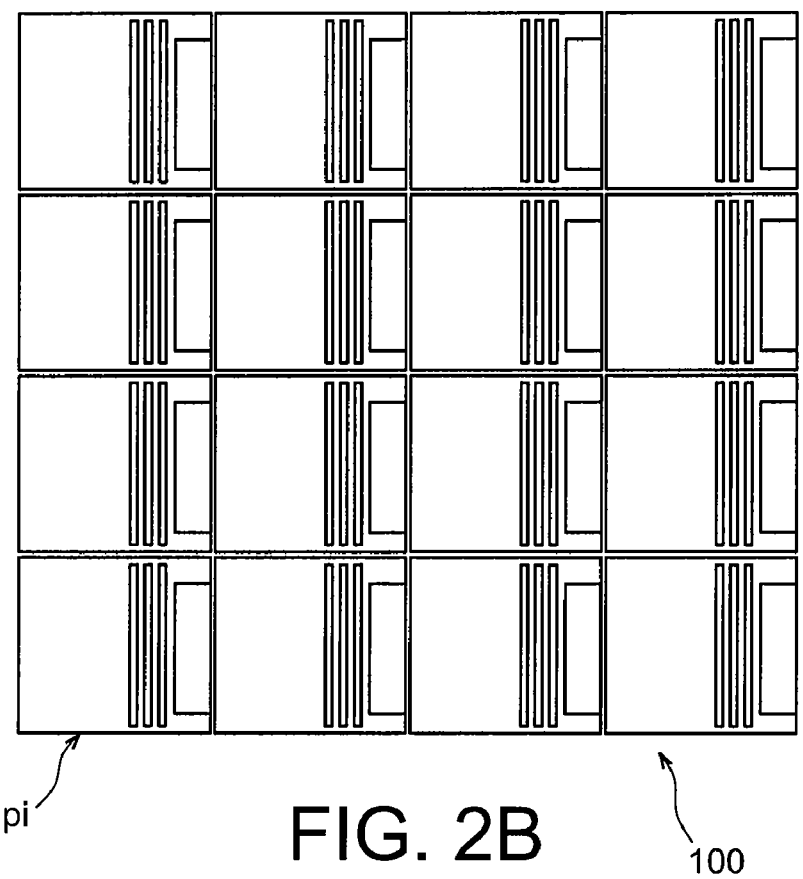

The elementary cells or pixels $p_i$ (FIG. 2B) may be produced in CMOS technology and have a size for example around 1 or several micrometers of side d, and comprise respectively, at least one photosensitive zone 110, provided for the capture of photon(s) and the conversion of photon(s) into electron(s).

The elementary cells or pixels $p_i$ are also each provided with means for increasing or amplifying the number of electrons converted by the photosensitive zone and which will be designated a "multiplier 120 of electrons". Such a multiplier uses electronic avalanche processes and is provided to increase the number of electrons converted by the photosensitive zone 110, by means of ionisation(s) by impact(s), during cycles known as electron "multiplication" or "amplification" cycles.

Such a multiplier 120 may be formed of CMOS capacities. The multiplier 120 comprises at least two control gates, preferably at least 3 control gates G1, G2, G3, which may be in the form of juxtaposed electrodes formed opposite or above a semi-conducting zone wherein the electrons are intended to circulate. The gates G1, G2, G3, make it possible, depending on the manner wherein they are polarised, to displace said electrons in said semi-conducting zone and to make them make one or several back-and-fro journeys in this semi-conducting zone, while producing at each back-and-fro journey one or several ionisation by impact processes.

The gates G1, G2, G3, are each intended to receive a control signal from an external control circuit 150. The control circuit 150 may be integrated on the same chip or the same substrate as the imager or if necessary be formed on another support.

During a multiplication phase, each gate may be intended to receive a control signal according to a predetermined amplitude(s) sequence, different to that of the other control signals received by the other gates of the multiplier. Differences in potentials between the gates may make it possible to carry out transfers of electrons from one place to another of the semi-conducting zone, and to generate new electrons through ionisation by impact during these transfers.

The ratio between the number of electrons converted by the photosensitive zone and at the input of the multiplier, and the number of electrons at the output of the multiplier 120, gives the gain known as "amplification" or "multiplication" gain of the multiplier 120. For example for a gain of 2% at each transfer, after 235 transfers, the number of electrons produced by the photosensitive zone 110 may be multiplied by 100.

The multiplication gain of a cell may be adapted or modulated by the control circuit 150.

Different multiplication gains may also be applied from one cell to the other of the array.

The elementary cells or pixels $p_i$ may also be provided with a reading circuit 140. The reading circuit 140 may be, or may comprise, for example, at least one charge/voltage converter to convert a quantity of charges from the multiplier 120 into an electric voltage.

According to another possibility, the reading circuit may be, or may comprise, for example, at least one charge/current converter to convert a quantity of charges from the multiplier 120 into an electric current.

The reading circuit 140 may be formed of a plurality of transistors for example of 3 transistors (the reading circuit then being qualified as "3T" circuit) or 4 transistors (the reading circuit then being qualified as "4T" circuit). The voltage converted by the reading circuit may then be conveyed by means of interconnections to an analogue-digital converter (not represented).

Figure 3:
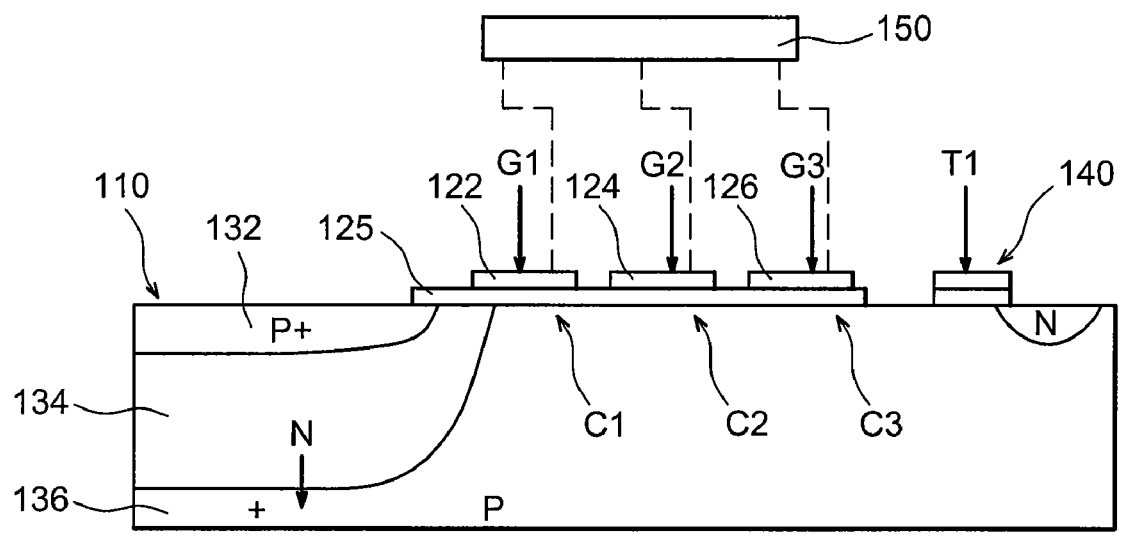
FIG. 3, illustrates an example of imaging device provided with electronic avalanche multiplier loans comprising several control gates, the device being represented as a sectional view.
Figure 4A:
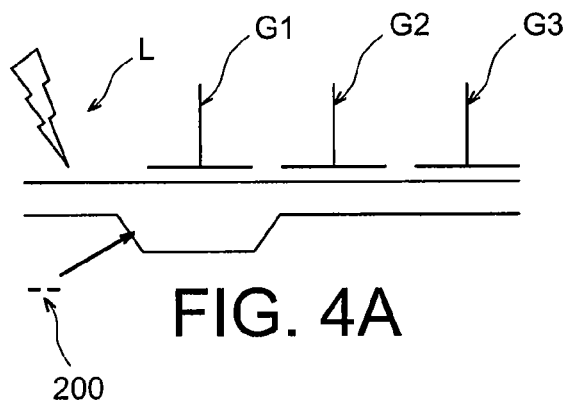
FIG. 4A-4F illustrate an example of operation of electronic avalanche multiplier means, within an imaging device according to the invention.
Figure 4B:
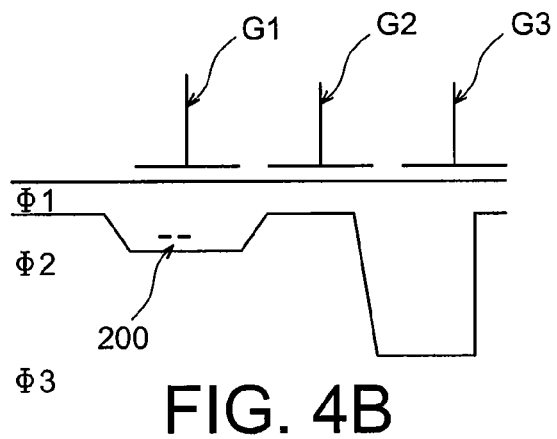
Figure 4C:
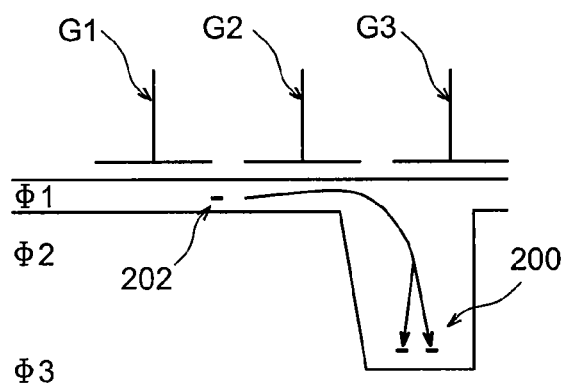
Figure 4D:
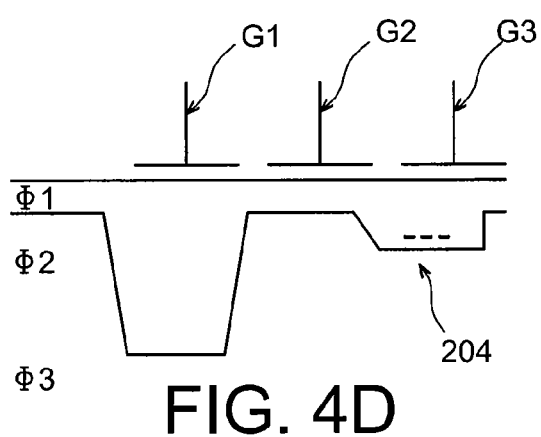
Figure 4E:
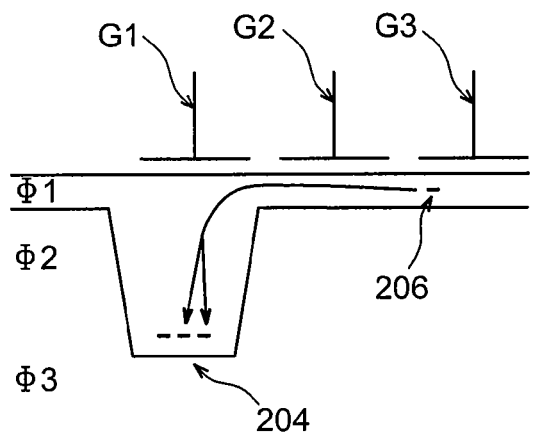
Figure 4F:
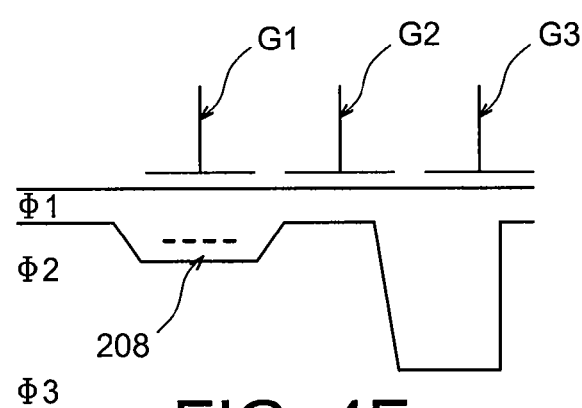

In FIG. 3, a transversal sectional view of a pixel $p_i$ of an imager, formed in a substrate 100, is given.

The multiplier 120 is formed, in this example, of 3 MOS juxtaposed capacities comprising respectively a gate, a gate dielectric zone, and a channel zone. The gates G1, G2, G3 of the multiplier 120 may be for example in the form of disjointed zones 122, 124, 126 based on polysilicon or ITO (Indium Titanium Oxide), and separated by a semi-conducting zone 130 for example based on silicon, or germanium, by a layer of dielectric material 125, for example based on silicon oxide, or $HfO_2$, on which these zones 122, 124, 126 lie.

A formation of gates G1, G2, G3, of the electron multiplier 120 by means of a transparent conductor material, such as for example ITO, may enable the surface of the illuminated zone to be maximised.

The semi-conducting zone may be doped in such a way that a conduction channel can be created under the gates G1, G2, G3. The channel may be "on the surface" in other words formed on the surface of the substrate, or "buried", so that a non-zero thickness exists between the surface of the substrate and the channel.

The photosensitive zone 110 may be for example a photodiode.

In this example, the substrate comprises a first doped zone 132, for example P+ doped, on the surface of the substrate 100, above a second doped zone 134, for example N doped, and forming a junction with the first zone 132, as well as a third doped zone 136, for example P doped below the second doped zone 134. The device thus comprises a first channel zone C1 opposite the first gate G1, a second channel zone C2 opposite the second gate G2, and a third channel zone C3 opposite the third gate G3. The photo-generated electron-hole pairs are separated in a space charge zone, then cross the multiplier 120 where the number of electrons is increased before being converted into a voltage by the reading circuit 140.

In FIG. 3, a transistor noted T1 formed next to the gates G1, G2, G3, and belonging to the reading circuit 130, is represented.

An example of operation of a pixel provided with an avalanche electron multiplier, as well as a method for "multiplying" electrons, will now be described in reference to FIGS. 4A-4F and FIG. 5.

In FIGS. 4A-4F, a multiplier with its 3 gate electrodes G1, G2, G3, is represented during multiplication phases, with the barriers or potential wells generated during these phases in the channel zones C1, C2, C3 situated respectively opposite gate electrodes G1, G2, G3, as a function of a first signal SG1, applied to the first gate G1, a second signal SG2, applied to the second gate G2, and a third signal SG3, applied to the third gate G3.

The signals SG1, SG2, SG3, are generated by the control circuit 150 and then adopt multiplication phases, different potential values, provided according to predetermined or pre-established sequences. These sequences of signals may be provided as a function of a desired multiplication or amplification gain, or an estimation of a number of electrons that it is wished that the multiplier produces.

Figure 5:
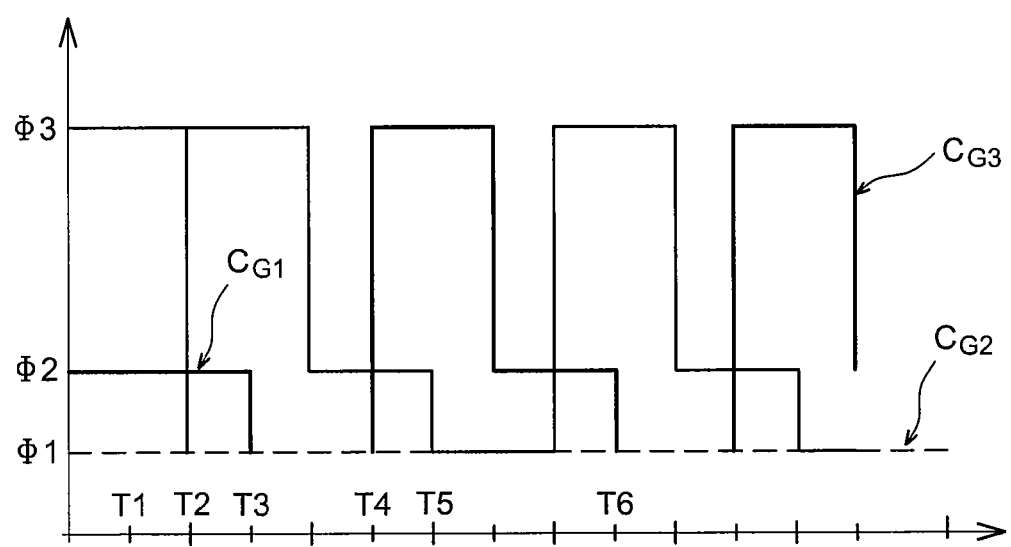
FIG. 5, represents an example of chronogram of the operation of control signals of electronic avalanche multiplier means, within an imaging device according to the invention.

In FIG. 5, chronograms $C_{G1}$, $C_{G2}$, $C_{G3}$ give examples of sequences that the signals generated on the gates G1, G2, G3 respectively adopt.

Following an exposure of the photosensitive zone 110 to a light radiation L, a group 200 of electrons has been generated.

Firstly (FIG. 4A and step T1 in FIG. 5) potentials are applied to the gates G1, G2, G3, in such a way as to create a first potential well in the channel zone C1 situated opposite the first gate G1 and to attract the group of electrons resulting from the conversion of photons. To do this, the first gate G1 may be placed at a potential $\Phi 2$, for example around 2 volt whereas the second gate G2 and G1 are placed at a potential $\Phi 1$ less than $\Phi 2$.

Then (FIG. 4B and step T2 in FIG. 5), a second potential well is formed, larger than the first well, in the channel zone C3 opposite the third gate G3, whereas the channel C2 opposite the second gate G2 is blocked. To do this, the third gate G3 may be placed at a potential Φ3, for example around 10 volts greater than Φ2, whereas the second gate G2 and the first gate G1 are maintained respectively at the potential Φ1 and at the potential Φ2.

Then (FIG. 4C and start of a step T3 in FIG. 5), in the zone opposite the first gate G1, the potential barrier is raised in such a way as to displace the group 200 of electrons opposite the third gate G3 in the second potential well. During this displacement, one or several additional electrons 202 are generated through ionisation by impact. To do this, at the start of step T3, the first gate G1 may be placed at the potential Φ1. The group of electrons 200 as well as the additional electrons 202 are then grouped together in the second potential well to form a new group 204 of electrons, greater than the group 200.

Then, the potential well opposite the third gate G3 is raised (end of step T3 in FIG. 5) for example by placing the third gate G3 at the potential Φ1.

Then (step T4 in FIG. 5 and FIG. 4D) a third potential well is formed opposite the first gate G1, larger than that opposite the third gate G3, whereas the second gate is maintained at the same potential. To do this, the first gate G1 may be placed at the potential Φ3, whereas the second gate G2 and the third gate G3 are maintained respectively at the potential Φ1 and at the potential Φ2.

Then (step T5 in FIG. 5 and FIG. 4E), in the zone opposite the third gate G3, the potential barrier is raised in such a way as to displace the group 204 of electrons opposite the third gate G3 in the second potential well. To do this, during the step T5, the third gate G3 may be placed at the potential Φ1, whereas the second gate G2 and the third gate G1 are maintained respectively at the potential Φ1 and at the potential Φ3. During this displacement, one or several additional electrons 206 are generated through ionisation by impact. The group of electrons 204 as well as the additional electrons 206 then group together in the potential well opposite the first gate to form a new group 208 of electrons, larger than the group 204.

Then (step T6 and following in FIG. 5 and FIG. 4F), the multiplication process may be reiterated.

Potential sequences applied to the gates G1, G2, G3 have made it possible to transfer electrons situated under the gate G1 towards the channel situated under the gate noted G3, then to transfer from the channel under the gate G3 towards the channel under the gate G1. A two directional transfer or back-and-fro journey of the electrons in the multiplier 120 has thus been carried out. During each transfer, the potential difference between the central gate G2 and the gate towards which the electrons are transferred is provided in such a way so as to create an electric field in the semi-conducting zone opposite gates, sufficiently high to bring about at least one ionisation by impact during the transfer of electrons.

At each transfer, the number of electrons may be increased. The "amplification" or "multiplication" gain may be for example around 1% per transfer. This value makes it possible to optimise the signal to noise ratio of the device. By increasing the number of back-and-fro journeys between the gates G1 and G3, typically several tens or hundreds of back-and-fro journeys, the number of electrons may be multiplied considerably. At the end of the multiplication process, the quantity of electrons is transformed into voltage by the reading circuit 140.

The "amplification" or "multiplication" gain or the number of electrons produced may be adapted or modified by adapting or modifying the sequence of signals generated and applied to the gates. A reiteration of several sequences such as that described above may for example make it possible to increase the number of back-and-fro journeys made by the electrons and to increase the number of additional electrons produced by the multiplier 120.

The voltage or amplitude value necessary to bring about an ionisation is determined in particular by the distance between the gates G1, G2, G3, for example around 40 nanometers, the type of doping, for example a P doping, and the doping dose of the semi-conducting zone opposite the gates, for example around $10^{15}$ atoms/cm$^3$ and by the type of gate dielectric material used, for example $SiO_2$ of thickness around several nanometers, for example around 3 nanometers.

In an imaging architecture according to the invention, each pixel may be addressable individually, for example by means of an addressing in lines and columns. Each multiplier 120 may be driven or controlled individually by means of the control circuit 150, so that the gain of each multiplier 120 may be adapted or modified individually.

Different amplification or multiplication gains may be provided for between the pixels, for example according to their positioning in the array, for example to take account of dispersions or edge effects.

To apply different amplification gains from one pixel or from one cell to the other of the array, in other words to carry out multiplication or amplification cycles of the number of electrons with different gains from one pixel to the other, the control circuit may be provided to apply different sequences of signals to the gates of the different pixels. Such sequences may be generated by means of logic circuits for example.

It is possible to apply, for example, to at least one first pixel, a first sequence of signals to the three gates of the multiplier of this first pixel and to apply, for example, to at least one second pixel, a second sequence of signals to the three gates of the multiplier of this second pixel. According to one possibility, the second sequence may be for example a repetition of a given number X, times the first sequence. For example, a first sequence of signals similar to that illustrated in FIG. 5 may be applied to the gates G1, G2, G3 of one or several pixels of the imager, whereas another sequence of signals is applied to the gates G1, G2, G3, of one or several pixels of the imager, the other sequence being a repetition of the first sequence. Thus, by repeating the first sequence, the number of back-and-fro journeys of the electrons and possibility of ionisation are increased.

Different amplification or multiplication gains between pixels may be applied as a function of the quantity of charge converted by their respective photosensitive zones.

The amplification or multiplication gain of a pixel may be modified and adapted as a function of the quantity of charge converted by their respective photosensitive zones, detected by the reading circuit.

The reading circuit 140 may be laid out in such a way so as not to disrupt the electrons present in the multiplier. To do this, a-transfer transistor $T_1$ may be provided for between the multiplier 120 and the reading circuit 140 or at the input of the reading circuit 140. When the multiplier 120 is linked to the gate of a follower transistor of a reading 3T circuit, or when the reading circuit is a 4T circuit, and that the multiplier is for example situated between a transfer and a follower transistor, several readings of the charge present in the multiplier 120 may be carried out, throughout an amplification cycle. The reading circuit may thereby be provided to carry out one or several readings of the pixel during an electron multiplication cycle.

Such an operation makes it possible to obtain an improved dynamic. During an electron multiplication cycle, if the initial signal is strong, when the pixel is strongly illuminated, to avoid the multiplier become saturated after a certain number of amplification cycles, several readings may be carried out, for example before any amplification cycle, after N amplification cycles, then after K*N amplification cycles. A value of the signal before saturation is thereby available, and makes it possible to preserve the dynamic of the image obtained.

By carrying out periodic readings, for example at least one first reading after N amplification cycles, and at least one second reading after K+N amplification cycles, the gain of each pixel may be evaluated by the reading circuit 140 by comparing the first reading and the second reading. It is thereby possible to deduce from this precisely the gain of the multiplier of each pixel, and then to circumvent gain non-uniformities on the array of pixels, as well as gain variations due, for example, to supply voltage variations or the temperature within the array.

An avalanche CMOS imaging device according to the invention conserves the main advantages of CMOS imagers, such as rapidity, the possibility of carrying out a partial reading of the array (i.e. of one or several pixels or of one or several rows of the array among all the rows of pixels), possible integration of logic circuit within the pixel.

A "correlated double sampling" type sampling can also be carried out, as described in the document "A New Correlated Double Sampling (CDS) Technique for Low Voltage Design Environment in Advanced CMOS Technology", Xu et al., Solid state circuits conference 2002, 24 Sep. 2002, pages 117-120, and which makes it possible to improve the performance in terms of signal to noise ratio.

It is possible to integrate the electron multiplier 120 in different places of a pixel or a cell of the imager.

According to a first possibility, the multiplier may be integrated directly in the illuminated photosensitive zone, for example in the photodiode.

Figure 6A:
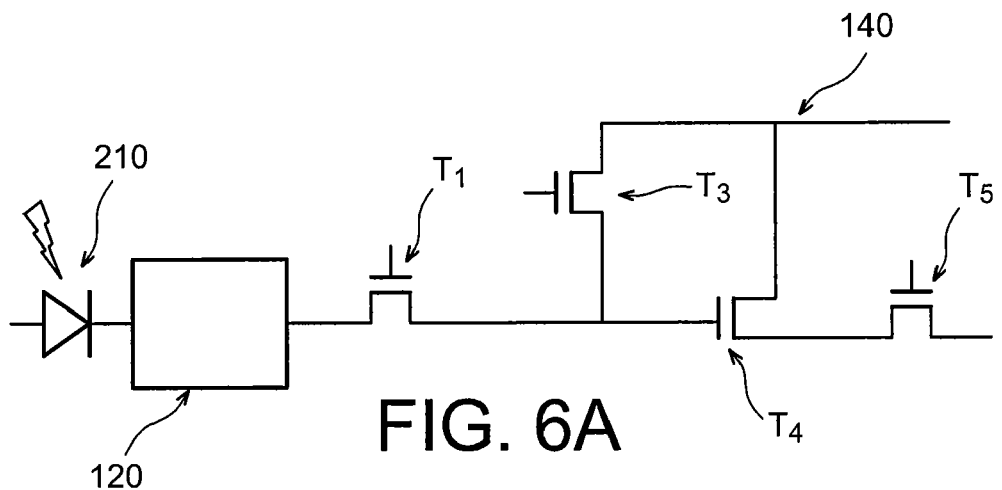
FIGS. 6A-6B illustrate alternative lay outs of electronic avalanche multiplier means in an imaging device according to the invention.

According to a second possibility (FIG. 6A), the multiplier 120 may be placed between the photosensitive zone, for example a photodiode 210 and a reading circuit 140.

Figure 6B:
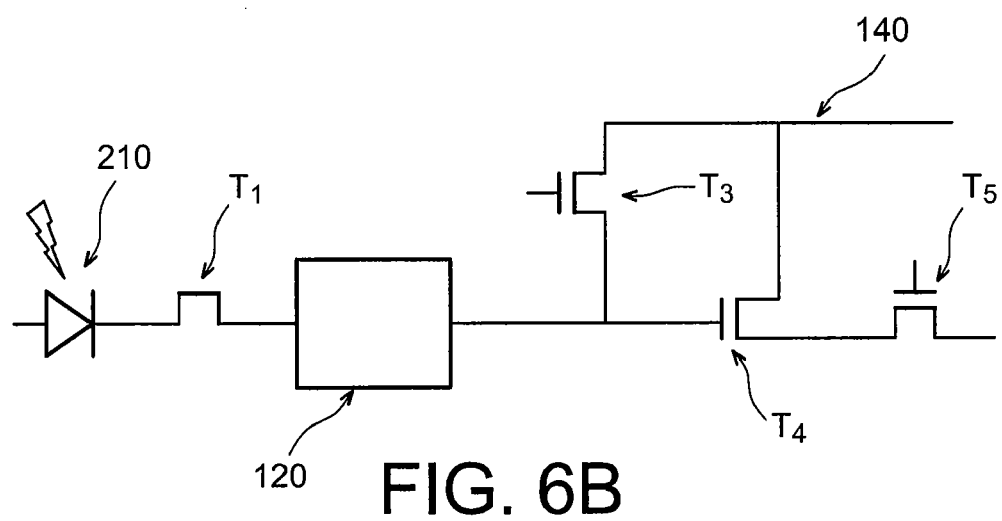

According to a third possibility (FIG. 6B), the multiplier 120 may be integrated in the reading circuit 140, for example between a transfer transistor $T_1$ of this circuit and a plurality of transistors $T_2$, $T_3$, $T_4$, forming a follower.

For the multiplier 120 to work properly, a number of at least 3 gates G1, G2, G3 may be preferable. One of said gates may serve to store the electrons, another gate makes it possible to apply a voltage necessary to attract the electrons and to carry out an ionisation by impact, and another gate makes it possible to block the passage of electrons before the ionisation voltage is reached. In the example that has been described previously, the first gate G1 and the third gate G3 alternately fill the role of storage gate and attraction gate. The second gate G2 may for its part play the role of blocking of electrons before the ionisation energy is reached.

Additional gates may if necessary be added, for example to insulate the multiplier of the photosensitive zone 110 or the reading circuit 130.

According to one embodiment possibility, the multiplier 120 may be masked by a level of metal generally known as "dark metal" for example based on aluminium or copper, formed above the gates G1, G2, G3.

According to another possibility, the multiplier 120 may be used in an illuminated zone. In this case, electrons will be photo-generated in the multiplier 120.

The duration of one multiplication step must be provided to be short with regard to the capture time of the image, for example at least 100 times or at least 1000 times shorter than the image capture time.

To avoid edge effects, as well as the constraints of a lateral insulation, the gates G1, G2, G3 may each have an annular shape. The gates G1, G2, G3 may be in the form of concentric contours, for example 3 concentric contours.

Figure 7:
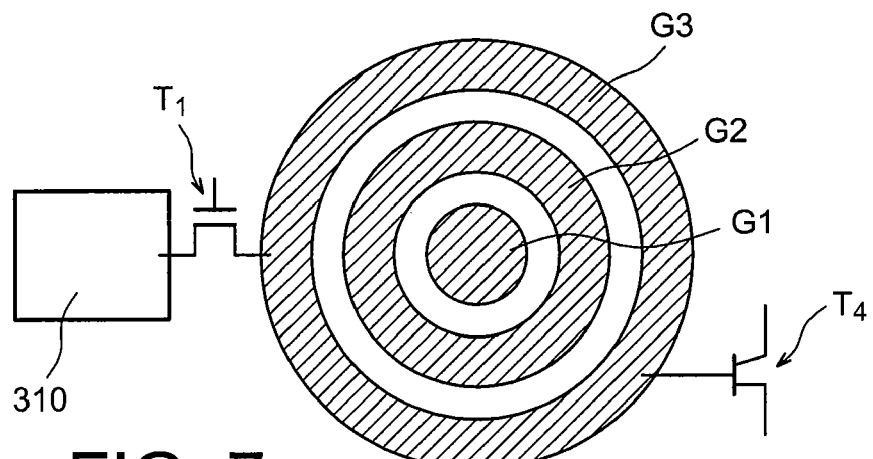
FIG. 7 illustrates an example of photosensitive microelectronic detector device provided with electronic avalanche multiplier means comprising several control gates, the device being represented as a top view.

In FIG. 7, an example of photosensitive microelectronic detector device, provided with electronic avalanche multiplier means comprising several control gates G1, G2, G3, having the shape of concentric circles is represented as a top view. In this example, a transfer transistor $T_1$ (represented in a schematic manner in this figure) is provided between a photosensitive zone 310 and the gates G1, G2, G3 of the multiplier means, whereas the gate G3 that surrounds the two other gates G1 and G2, may be connected to the gate electrode of a transistor T4 of the reading circuit.

The integration of several metal gates in a pixel could lead to reducing the actual photosensitive surface area of the pixel. In order to have a greater photosensitive surface area, the imager pixel according to the invention may be formed in "backside" technology, wherein the light arrives by one face of the pixel, for example the rear face whereas the reading circuit and the multiplier are positioned at the level of the other face, for example on the front face, which enables a maximum of photons to be collected.

According to an alternative, the pixels of Imagers according to the invention may be produced in an "above IC" technology, as described in the document "A highly reliable amorphous photosensor for above IC CMOS image sensor", wherein the photosensitive zone is produced above the reading circuit and the electron multiplier.

An imaging device according to the invention with an avalanche multiplier integrated with a pixel, in particular of CMOS type, makes it possible in particular to circumvent the main limitations of avalanche CCD devices: such as the noise and the variation in the gain of the multiplier as a function of the environmental and ageing conditions.

The invention claimed is:

1. A microelectronic image sensor array device comprising:
   a plurality of elementary cells laid out according to an array;
   at least a first cell and a second cell of said array being each provided with
   at least one photosensitive zone for capturing one or more photons and converting said one or more photons into one or more electrons;
   an electronic avalanche multiplier device configured to produce, during a cycle known as a "multiplication" cycle, according to a multiplication gain, a higher number of electrons than a number of electrons converted by the photosensitive zone, the multiplier device being formed of a plurality of gate electrodes; and
   a control circuit configured to apply control signals to gates of the multiplier devices of the cells of the array, the control circuit being adapted to apply first control signals to gates of a first multiplier device of at least a first cell of said array, and to apply second control signals, different from said first control signals, to gates of a second multiplier device of said second cell of the array, said first multiplier device having a first multiplication gain and said second multiplier device having a second multiplication gain, said first multiplication gain and said second multiplication gain being different and individually modifiable.

2. The microelectronic image sensor device according to claim 1,
wherein said control circuit of said gates is configured to apply at least one first control signal to a first gate of the multiplication device of a given cell, at least one second control signal of said multiplication device of said given cell, and at least one third control signal to a third gate of said multiplication means of said given cell,
wherein the first control signal is applied according to a first sequence, the second control signal according to a second sequence, and the third control signal according to a third sequence, and
wherein the first sequence, the second sequence, and the third sequence are provided as a function of a desired multiplication gain.

3. The microelectronic image sensor device according to claim 2,
wherein the control circuit of said gates is adapted to modify the first sequence, the second sequence, and the third sequence.

4. The microelectronic image sensor device according to claim 1,
wherein the first control signals follow first sequences and the second control signals follow second sequences.

5. The microelectronic image sensor device according to claim 4,
wherein the second sequences are a repetition of a given number X, times the first sequences.

6. The microelectronic image sensor device according to claim 1,
wherein the electron multiplication devices comprise at least 3 gates.

7. The microelectronic image sensor device according to claim 1,
wherein at least several cells each further comprise at least one reading circuit configured to read a quantity of charge produced by said photosensitive zone.

8. The microelectronic image sensor device according to claim 7,
wherein the reading circuit comprises, or is formed of, at least one charge/voltage converter or at least one charge/current converter.

9. The microelectronic image sensor device according to claim 7,
wherein the multiplier devices are integrated in the reading circuit.

10. The microelectronic image sensor device according to claim 7,
wherein the multiplier devices are situated between the photosensitive zone and the reading circuit.

11. The microelectronic image sensor device according to claim 7,
wherein the reading circuit is configured to carry out a reading of the quantity of charge produced by said photosensitive zone, prior to a multiplication cycle of said quantity of charge.

12. The microelectronic image sensor device according to claim 7,
wherein the reading circuit is configured to carry out a periodic reading of the quantity of charge produced by said photosensitive zone.

13. The microelectronic image sensor device according to claim 1, further comprising:
at least one reading circuit configured to read a quantity of charge produced by at least one photosensitive zone, said control circuit being adapted to modify, after a reading carried out by the reading circuit, the multiplication gain of one or several given cells of the array as a function of a quantity of charge produced by their respective sensitive photosensitive zones.

14. The microelectronic image sensor device according to claim 7,
wherein said control circuit is adapted to modify, after a reading carried out by the reading circuit, the multiplication gain of one or several given cells of the array as a function of the quantity of charge produced by their respective sensitive photosensitive zones.

15. The microelectronic image sensor device according to claim 1, further comprising:
correlated multiple sampling means.

16. The microelectronic image sensor device according to claim 1,
wherein the photosensitive zone is situated on a given face or a given side of a substrate, wherein the gates of the multiplier devices are formed on said given face or on said given side of said substrate.

17. The microelectronic image sensor device according to claim 16,
wherein the photosensitive zone overlays the gates of the multiplier devices.

18. The microelectronic image sensor device according to claim 16,
wherein the photosensitive zone and the gates of the multiplier devices are juxtaposed.

19. A microelectronic image sensor array device comprising:
a plurality of elementary cells laid out according to an array;
at least a first cell and a second cell of said array being each provided with
at least one photosensitive zone for capturing one or more photons and converting said one or more photons into one or more electrons;
an electronic avalanche multiplier device configured to produce, during a cycle known as a "multiplication" cycle, according to a multiplication gain, a higher number of electrons than a number of electrons converted by the photosensitive zone, the multiplier device being formed of a plurality of gate electrodes;
a control circuit configured to apply control signals to gates of the multiplier devices of the cells of the array, the control circuit being adapted to apply first control signals to gates of a first multiplier device of at least a first cell of said array, and to apply second control signals, different from said first control signals, to gates of a second multiplier device of said second cell of the array; and
at least one reading circuit configured to read a quantity of charge produced by at least one photosensitive zone, said control circuit being adapted to modify, after a reading carried out by the reading circuit, the multiplication gain of one or several given cells of the array as a function of a quantity of charge produced by their respective sensitive photosensitive zones.

20. A microelectronic image sensor array device comprising:
a plurality of elementary cells laid out according to an array;
at least a first cell and a second cell of said array being each provided with at least one photosensitive zone for capturing one or more photons and converting said one or more photons into one or more electrons;

an electronic avalanche multiplier device configured to produce, during a cycle known as a "multiplication" cycle, according to a multiplication gain, a higher number of electrons than a number of electrons converted by the photosensitive zone, the multiplier device being formed of a plurality of gate electrodes; and a control circuit configured to apply control signals to gates of the multiplier devices of the cells of the array, the control circuit being adapted to apply, for a same image capture, first control signals to gates of a first multiplier device of at least a first cell of said array, and to apply second control signals, different from said first control signals, to gates of a second multiplier device of said second cell of the array.

21. The microelectronic image sensor device according to claim 1,
wherein different multiplication gains are provided for different pixels in the imaging array during the same exposure.

22. The microelectronic image sensor device according to claim 1,
wherein the avalanche multiplier in the first cell and the avalanche multiplier in the second cell are driven with respective different control signals to generate different gains during the same exposure.

* * * * *